United States Patent
Yoshida et al.

(10) Patent No.: US 8,461,690 B2
(45) Date of Patent: Jun. 11, 2013

(54) SEMICONDUCTOR DEVICE CAPABLE OF SUPPRESSING GENERATION OF CRACKS IN SEMICONDUCTOR CHIP DURING MANUFACTURING PROCESS

(75) Inventors: Masanori Yoshida, Tokyo (JP); Daisuke Tsuji, Tokyo (JP); Masahito Yamato, Tokyo (JP); Jun Sasaki, Tokyo (JP); Kaoru Sonobe, Tokyo (JP); Akira Ide, Tokyo (JP); Masahiro Yamaguchi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 231 days.

(21) Appl. No.: 12/969,909

(22) Filed: Dec. 16, 2010

(65) Prior Publication Data
US 2011/0147945 A1   Jun. 23, 2011

(30) Foreign Application Priority Data
Dec. 17, 2009   (JP) .................................. 2009-286351

(51) Int. Cl.
*H01L 29/40*   (2006.01)
(52) U.S. Cl.
USPC .......................................... 257/774; 257/686
(58) Field of Classification Search
USPC .................................................. 257/686, 774
See application file for complete search history.

(56) References Cited

U.S. PATENT DOCUMENTS
2005/0017338 A1 * 1/2005 Fukazawa .................... 257/686
2007/0007639 A1   1/2007 Fukazawa

FOREIGN PATENT DOCUMENTS
JP   2007-36184 A   2/2007

* cited by examiner

*Primary Examiner* — Bradley K Smith
(74) *Attorney, Agent, or Firm* — Foley & Lardner LLP

(57) ABSTRACT

A semiconductor device includes a chip stacked body where a plurality of semiconductor chips are stacked, and penetration electrodes respectively formed in the semiconductor chips are electrically interconnected in stacking order of the semiconductor chips, a first support member that is disposed to face a first semiconductor chip formed in one end of the chip stacked body, and including electrodes electrically connected to the penetration electrodes of the first semiconductor chip, and a wiring board that is disposed to face a second semiconductor chip formed in an end opposed to the one end of the chip stacked body, and including external electrodes on a surface opposed to a surface facing the second semiconductor chip that is to be electrically connected to the penetration electrodes of the second semiconductor chip.

22 Claims, 7 Drawing Sheets

SEMICONDUCTOR DEVICE CAPABLE OF SUPPRESSING GENERATION OF CRACKS IN SEMICONDUCTOR CHIP DURING MANUFACTURING PROCESS

This application is based upon and claims the benefit of priority from Japanese Patent Application No. 2009-286351 filed on Dec. 17, 2009, the content of which is incorporated by reference.

BACKGROUND OF THE INVENTION

1. Field of the Invention

The present invention relates to a semiconductor device of a chip-on-chip (CoC) type, and a method for manufacturing the same.

2. Description of the Related Art

Recently, with miniaturization and higher functionality of an electronic device, a study has been conducted on the semiconductor device of the CoC type which includes a plurality of semiconductor chips having penetration electrodes.

Concerning a method for manufacturing the semiconductor device of the CoC type, there is known a method for sequentially stacking a plurality of semiconductor chips having penetration electrodes on a wiring board or a support board, filling gaps among the semiconductor chips with underfillers, and then sealing the plurality of semiconductor chips with a resin to cover the entire chips including the underfillers.

A configuration of such a semiconductor device of a CoC type is described in, for example, Japanese Patent Application Laid-Open No. 2007-36184 (hereinafter, "Patent Document").

The semiconductor device disclosed in the Patent Document has a structure where a plurality of semiconductor chips are stacked on a wiring board, the semiconductor chips are electrically connected to each other by penetration electrodes respectively formed on the semiconductor chips, and the penetration electrodes are exposed from a surface of the semiconductor chip disposed on a top stage. This structure results in generation of stress during expansion or contraction of the penetration electrodes due to a temperature change in the manufacturing process. Maximum stress is applied on a penetration electrode portion of the semiconductor chip disposed on the top stage, generating cracks in the semiconductor chip disposed on the top stage.

SUMMARY

In one embodiment, there is provided a semiconductor device that includes a chip stacked body where a plurality of semiconductor chips are stacked, and penetration electrodes respectively formed in the semiconductor chips are electrically interconnected in stacking order of the semiconductor chips, a first support member that is disposed to face a first semiconductor chip formed in one end of the chip stacked body, and including electrodes electrically connected to the penetration electrodes of the first semiconductor chip, and a wiring board that is disposed to face a second semiconductor chip formed in an end opposed to the one end of the chip stacked body, and including external electrodes on a surface opposed to a surface facing the second semiconductor chip to be electrically connected to the penetration electrodes of the second semiconductor chip.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
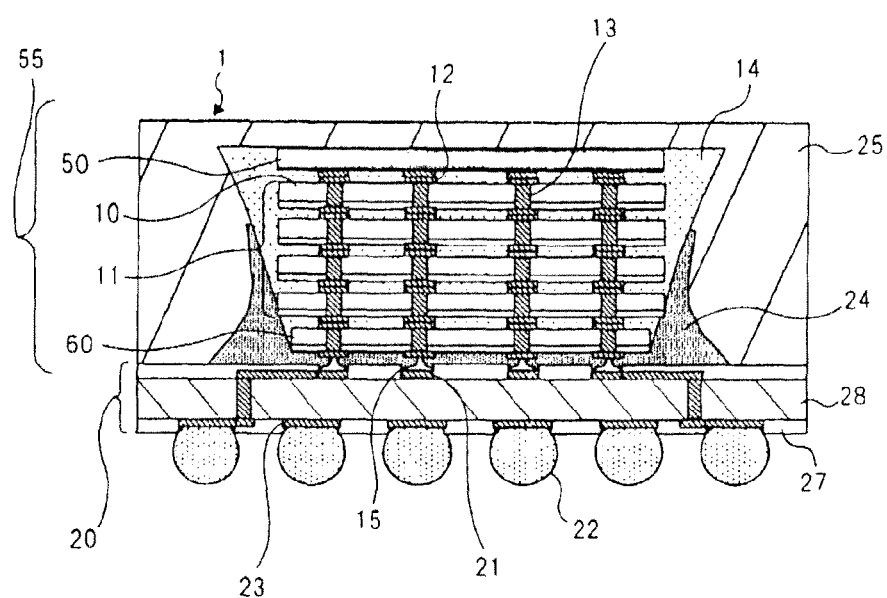
FIG. 1 is a sectional view showing a configuration example of a semiconductor device according to a first embodiment of the present invention.

FIG. 1 is a sectional view showing a configuration example of a semiconductor device according to a first embodiment.

As shown in FIG. 1, semiconductor device 1 according to the first embodiment includes chip stacked body 11 in which a plurality of semiconductor chips 10 having penetration electrodes are stacked. Chip stacked body 11 is configured by stacking, for example, four semiconductor chips 10 that include memory circuits. Support chip 50 is disposed above chip stacked body 11, and an interface chip (hereinafter, "IF chip") 60 is disposed below chip stacked body 11. Semiconductor chip 10 on the bottom stage of chip stacked body 11 is connected and fixed to wiring board 20 via IF chip 60.

Semiconductor chip 10 includes a plurality of bump electrodes 12 on one surface that have a circuit and on the other surface that does not have a circuit. Bump electrodes 12 on one surface and bump electrodes 12 on the other surface are interconnected by penetration electrodes 13. Semiconductor chips 10 are connected to each other via bump electrodes 12 and by penetration electrodes 13.

Semiconductor chip 10 on the top stage of chip stacked body 11 corresponds to a semiconductor chip disposed in one end of chip stacked body 11 in a stacking direction of semiconductor chips 10. Semiconductor chip 10 on the bottom stage of chip stacked body 11 corresponds to a semiconductor chip disposed in an end opposite the one end of chip stacked body 11 in the stacking direction of semiconductor chips 10.

Support chip 50 serves as a support member to suppress application of stress generated by at least expansion or contraction of the penetration electrodes of chip stacked body 11 on semiconductor chip 10 on the top stage during the manufacturing process. For example, when the temperature changes after gaps among semiconductor chips 10 of chip stacked body 11 are filled with a resin, the penetration electrodes of each semiconductor chip 10 of chip stacked body 11 at least expand or contract, and stress due to the expansion or the contraction of the penetration electrodes becomes maximum in the semiconductor chip on the top stage of the chip stacked body. According to the present embodiment, support chip 50 is disposed above semiconductor chip 10 on the top stage. Thus, stress applied on semiconductor chip 10 on the top stage of chip stacked body 11 is applied on support chip 50 via bump electrodes 12 connected to penetration electrodes 13.

A plurality of semiconductor chips 10 are interconnected with one another to perform an electrical operation required of semiconductor device 1. Support chip 50 is stacked such that chip stacked body 11 is sandwiched between wiring board 20 and support chip 50. Support chip 50 is substantially free from performing the electrical operation required of semiconductor device 1.

Concerning the material for the support member, any substrate can be used as long as it includes electrodes electrically connectable to the penetration electrodes of semiconductor chip 10 on the top stage in chip stacked body 11. However, use of a silicon substrate having a thermal expansion coefficient closer to that of semiconductor chip 10 of chip stacked body 11 is recommended. For support chip 50, for example, a semiconductor chip that has a circuit function that not use any penetration electrode, a defective semiconductor chip (not operated by a circuit) that includes penetration electrodes, or a semiconductor chip that is electrically connected to a position different from that of any penetration electrode of chip stacked body 11, which includes penetration electrodes, can be used. The semiconductor chip that has the circuit function that not use any penetration electrode means a semiconductor chip that includes a circuit not connected to any penetration electrode while penetration electrodes are provided, or a semiconductor chip that includes a circuit not connected to any penetration circuit because no penetration electrode is provided. However, since this semiconductor chip is used as the support member, an operation of its circuit function is unnecessary.

Semiconductor chips 10 are stacked with one another over one surface of wiring board 20 such that penetration electrodes 13 of a lower one of semiconductor chips 10 are vertically aligned respectively with penetration electrodes 13 of an upper one of semiconductor chips 10. Support chip 50 may be free from including one or more penetration electrodes that are vertically aligned with associated one of ones of penetration electrodes 13 of the uppermost one of semiconductor chips 10.

In the semiconductor device shown in FIG. 1, a chip whose material is a silicon substrate as in the case of the substrate of semiconductor chip 10 and which includes bump electrodes 12 formed on one surface is used as support chip 50. The one surface faces semiconductor chip 10, and bump electrodes 12 formed on the surface are arranged corresponding to positions of bump electrodes 12 of semiconductor chip 10. An area of a plane (planar area) parallel to semiconductor chip 10 of support chip 50 is equal to that of semiconductor chip 10.

IF chip 60 includes a circuit to control semiconductor chip 10 of chip stacked body 11. As in the case of support chip 50, IF chip 60 serves as a second support member to receive stress applied on semiconductor chip 10 during the manufacturing process. One of two surfaces of IF chip 60 faces wiring board 20, and the other surface faces semiconductor chip 10 on the bottom stage of chip stacked body 11. On the one surface, bump electrodes 12 are arranged corresponding to positions of connection pads 21 of wiring board 20. On the other surface, bump electrodes 12 are arranged corresponding to positions of bump electrodes 12 of semiconductor chip 10.

In IF chip 60, as in the case of semiconductor chip 10, bump electrodes 12 located on the one surface and bump electrodes 12 located on the other surface are interconnected by penetration electrodes 13.

In a composite chip-stacked body that includes support chip 50, chip stacked body 11, and IF chip 60, gaps among the chips are filled with first sealing resin layer 14. A material of first sealing resin layer 14 is insulating resin. Gaps among semiconductor chips 10 are also filled with first sealing resin layer 14. In the configuration shown in FIG. 1, side faces of some chips of the composite chip-stacked body are covered with first sealing resin layer 14. As shown in FIG. 1, when semiconductor device 1 is seen from the side face, a section of first sealing resin layer 14 is roughly formed into a trapezoidal shape. First sealing resin layer 14 is formed by using, for example, a well-known underfiller.

Wiring board 20 that includes predetermined wirings is connected and fixed to IF chip 60 disposed on a short side (corresponding to the upper bottom of the trapezoid) of roughly trapezoidal first sealing resin layer 14. For wiring board 20, for example, a glass epoxy substrate including predetermined wirings formed in both surfaces is used. Each wiring except connection pads and lands is covered with insulating film 27 such as a solder resist film.

On one surface of wiring board 20, a plurality of connection pads 21 are formed to connect with IF chip 60. On the other surface, a plurality of lands 23 are formed to connect metal balls 22 that become external electrodes. These connection pads 21 are connected to predetermined lands 23 by wirings laid out in insulating base material 28. Lands 23 are arranged at predetermined intervals on the other surface of wiring board 20 in, for example, a grip shape. On surfaces of connection pads 21 on the side of IF chip 60, wire bumps 15 made of, for example, gold (Au) or copper (Cu) are formed. Wire bumps 15 are connected to bump electrodes 12 of IF chip 60.

The composite chip-stacked body and wiring board 20 are fixed together by adhesive member 24 such as nonconductive paste (NCP). Adhesive member 24 protects joined portions of wire bumps 15 and bump electrodes 12 of IF chip 60.

The composite chip-stacked body on wiring board 20 is sealed with second sealing resin layer 25. Metal balls 22 that become external terminals of semiconductor device 1 are connected to the plurality of lands 23 on the other surface of wiring board 20 on which the composite chip-stacked body is not mounted.

Next, referring to the drawings, a method for manufacturing the semiconductor device according to the first embodiment shown in FIG. 1 will be described.

FIGS. 2A to 2C and FIGS. 3A to 3D are sectional views illustrating an example of an assembling procedure of the composite chip-stacked body in the semiconductor device shown in FIG. 1.

When semiconductor device 1 according to the first embodiment is manufactured, support chip 50 and the plurality of semiconductor chips 10 including penetration electrodes 13 are first prepared. Semiconductor chip 10 includes a predetermined circuit such as a memory circuit formed on one surface of a roughly square plate semiconductor substrate made of silicon.

Figure 2A:
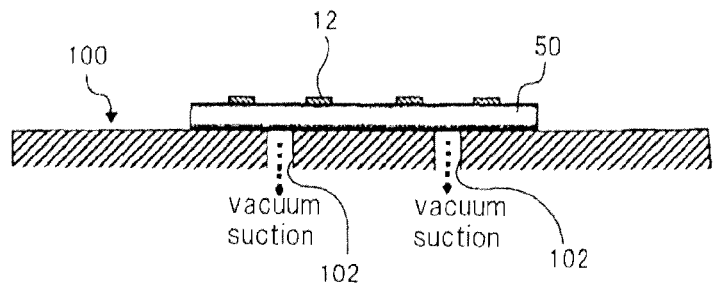
FIGS. 2A to 2C and FIGS. 3A to 3D are sectional views showing an example of an assembling procedure of a composite chip-stacked body in the semiconductor device illustrated in FIG. 1.

As shown in FIG. 2A, support chip 50 is placed on adsorption stage 100 with one surface including bump electrodes 12 set upward. Support chip 50 is sucked by vacuum via adsorption holes 102 formed in adsorption stage 100 by a vacuum apparatus (not shown) to be held on adsorption stage 100.

Figure 2B:
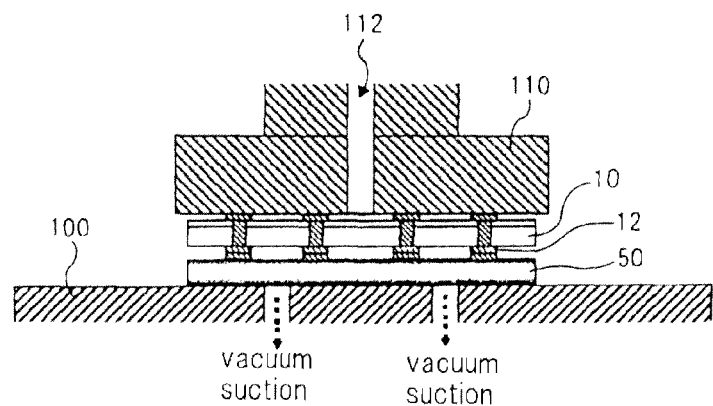

As shown in FIG. 2B, first-stage semiconductor chip 10 is mounted on support chip 50 held on adsorption stage 100. Semiconductor chip 10 is placed on support chip 50 by bonding tool 110 with one surface including a predetermined circuit set upward. In this case, semiconductor chip 10 is sucked via adsorption hole 112 of bonding tool 110 during the period, from fixing semiconductor chip 10 to bonding tool 110, to its mounting on support chip 50. Thus, semiconductor chip 10 never falls off from bonding tool 110. Semiconductor chip 10 is connected and fixed on support chip 50 by joining bump electrodes 12 on one surface of support chip 50 with bump electrodes 12 on the other surface where no circuit of semiconductor chip 10 is formed.

To join bump electrodes 12 together, for example, as shown in FIG. 2B, a thermocompression method can be used which apples a predetermined load on semiconductor chip 10 by bonding tool 110 set to a high temperature (e.g., about 300° C.). To join the two chips, not only the thermocompression method but also an ultrasonic compression method for compressing the chips while applying ultrasonic waves or a thermosonic compression method combining these methods can be used.

Figure 2C:
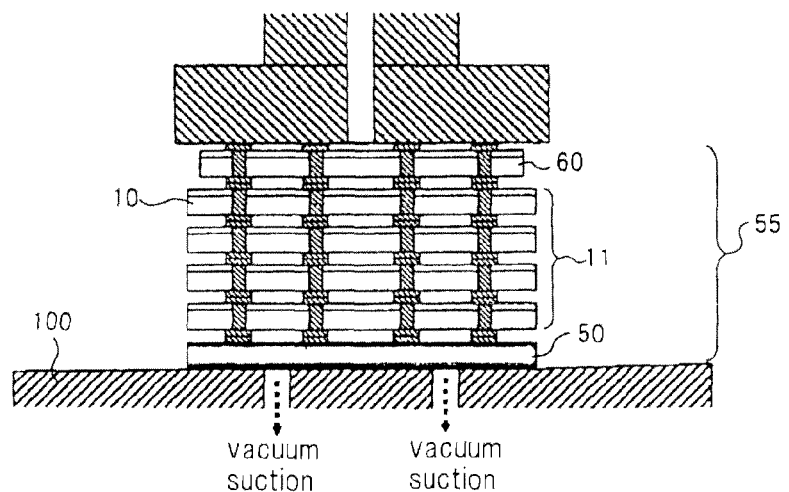

Second-stage semiconductor chip 10 is connected and fixed on first-stage semiconductor chip 10 by a procedure similar to that shown in FIG. 2B. Third-stage and fourth-stage semiconductor chips 10 are respectively connected and fixed on semiconductor chips 10 of the lower stages by a procedure similar to that shown in FIG. 2B. IF chip 60 is connected and fixed on fourth-stage semiconductor chip 10 by a procedure similar to that shown in FIG. 2B (see FIG. 2C). As shown in FIG. 2C, the result is a configuration where support chip 50, chip stacked body 11, and IF chip 60 are sequentially stacked. This configuration is an up-and-down reversal of composite chip-stacked body 55 shown in FIG. 1.

Figure 3A:
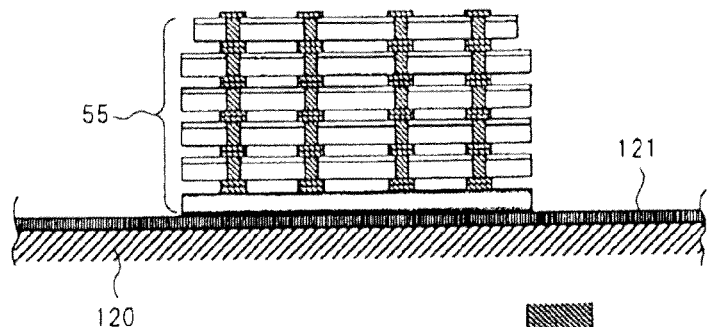

Composite chip-stacked body 55 shown in FIG. 2C is, for example, as shown in FIG. 3A, mounted on coating sheet 121 stuck to stage 120. For coating sheet 121, as in the case of a fluorinated sheet or a sheet on which a silicon adhesive is applied, a material with low wettability in first sealing resin layer 14 (e.g., underfiller) is used. Coating sheet 121 does not need to be directly stuck onto stage 120. Coating sheet 121 can be stuck to any flat surface, for example, predetermined fixtures placed on stage 120.

Figure 3B:
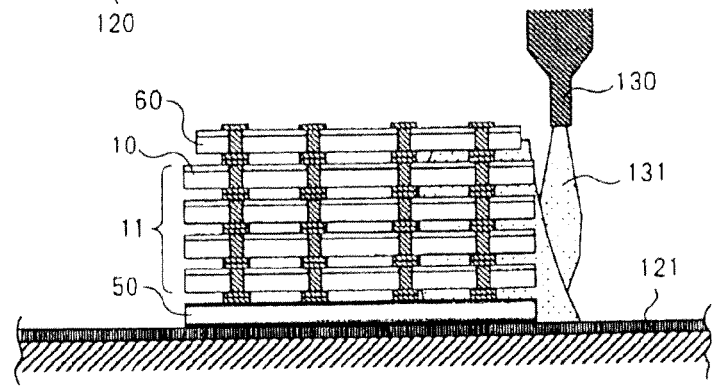

As shown in FIG. 3B, underfiller 131 is supplied to the plurality of semiconductor chips 10 placed on coating sheet 121 from near its end by dispenser 130. Supplied underfiller 131 advances through the gaps among semiconductor chips 10 by a capillary phenomenon while forming fillets around the plurality of loaded semiconductor chips 10, thereby filling the gaps among semiconductor chips 10. Underfiller 131 fills not only the gaps among semiconductor chips 10 but also the gap between support chip 50 and semiconductor chip 10 and the gap between IF chip 60 and semiconductor chip 10.

According to the present embodiment, the material with low wettability in underfiller 131 is used for coating sheet 121. Thus, spreading of underfiller 131 is suppressed to prevent an increase in fillet width.

Figure 3C:
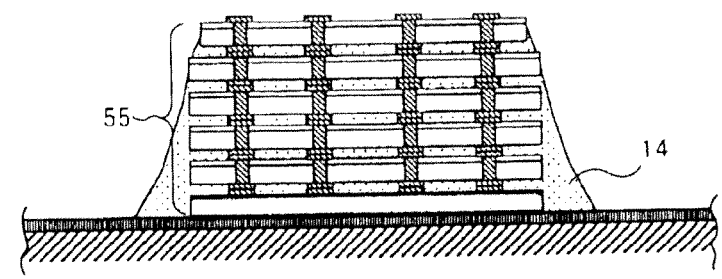

Underfiller 131 is hot-cured by curing composite chip-stacked body 55 to which underfiller 131 has been supplied at a predetermined temperature, e.g., 150° C. (heat treatment) while composite chip-stacked body 55 is kept on coating sheet 121. As a result, as shown in FIG. 3C, first sealing resin layer 14 is formed which includes underfiller 131 to cover the surroundings of composite chip-stacked body 55 and fill the gaps among the chips.

According to the present embodiment, for coating sheet 121, the sheet made of the material with low wettability in underfiller 131 is used. Thus, sticking of underfiller 131 to coating sheet 121 during the hot curing is prevented.

Figure 3D:
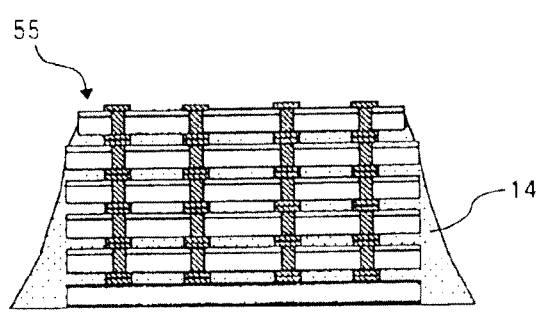

After the hot curing of first sealing resin layer 14, composite chip-stacked body 55 including first sealing resin layer 14 is picked up from coating sheet 121 (see FIG. 3D). According to the present embodiment, the sheet made of the material with low wettability in underfiller 131 is used for coating sheet 121. Thus, chip stacked body 11 can be easily picked up from coating sheet 121.

Chip stacked body 11 may shift in position while underfiller 131 is supplied to chip stacked body 11. In such a case, underfiller 131 can be supplied after chip stacked body 11 is temporarily fixed to coating sheet 121 by using a resin adhesive.

In a structure where first sealing resin layer 14 is buried among the chips of composite chip-stacked body 55, composite chip-stacked body 55 and first sealing resin layer 14 are integral. Hereinafter, therefore, this structure is referred to as a composite chip-stacked body.

Next, referring to the drawings, a procedure until the semiconductor device according to the first embodiment is assembled after the composite chip-stacked body is thus manufactured will be described.

FIGS. 4A to 4C and FIGS. 5A to 5C are sectional views showing an example of a procedure until the semiconductor device shown in FIG. 1 is assembled by using the composite chip-stacked body shown in FIG. 3D. FIGS. 4A to 4C and FIGS. 5A to 5D show an assembling example for forming a plurality of semiconductor devices 1 in a lump.

To assemble semiconductor device 1, wiring board 20 that includes a plurality of product forming portions 26 arranged in a matrix is first prepared. Each product forming portion 26 constitutes wiring board 20 of semiconductor device 1, and includes a wiring having a predetermined pattern. Each wiring except wire bumps 15 and lands 23 is covered with an insulating film such as solder resist film. A portion between product forming portions 26 of wiring board 20 serves as a dicing line to separate each semiconductor device 1 from the other.

On one surface of wiring board 20, the plurality of connection pads 21 is formed to connect with composite chip-stacked body 55. On the other surface, the plurality of lands 23 is formed to connect metal balls 22 that become external terminals. These connection pads 21 are connected to predetermined lands 23 by wirings.

Wire bumps 15 are arranged on connection pads 21. Wire bump 15 can be formed by joining, by using a wire bonding device (not shown), an Au or Cu wire melted to form its tip into a ball shape onto connection pad 21 of wiring board 20 based on, for example, the thermosonic compression method, and then cutting the wire. Forming wire bumps 15 on the wiring board side enables reduction in size and pitch of penetration electrodes 13 of semiconductor chip 10.

The present embodiment shows the example of forming wire bumps 15 on connection pads 21 to facilitate connection of wiring board 20 to composite chip-stacked body 55. However, connection pads 21 of wiring board 20 can be directly connected to bump electrodes 12 of the chip in composite chip-stacked body 55.

Figure 4A:
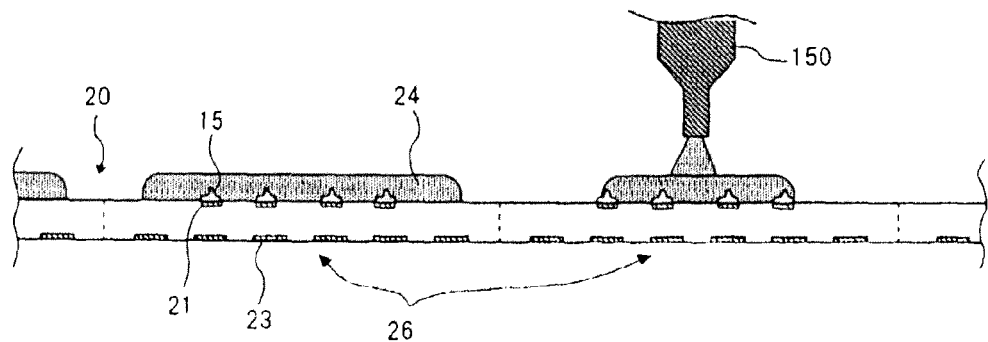
FIGS. 4A to 4C and FIGS. 5A to 5C are sectional views showing an example of a procedure until the semiconductor device shown in FIG. 1 is assembled by using the composite chip-stacked body shown in FIG. 3D.

After wiring board 20 has thus been prepared, as shown in FIG. 4A, insulating adhesive member 24 such as NCP is applied on each product forming portion 26 of wiring board 20 by dispenser 150.

Figure 4B:
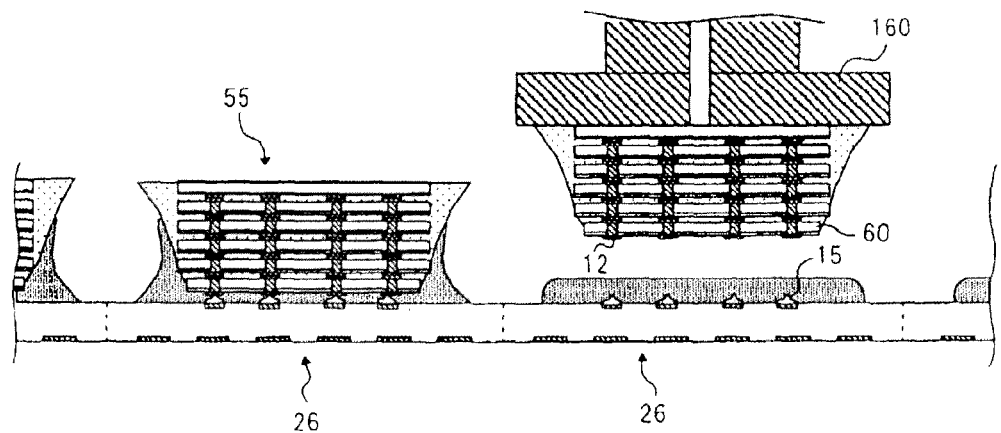
Figure 4C:
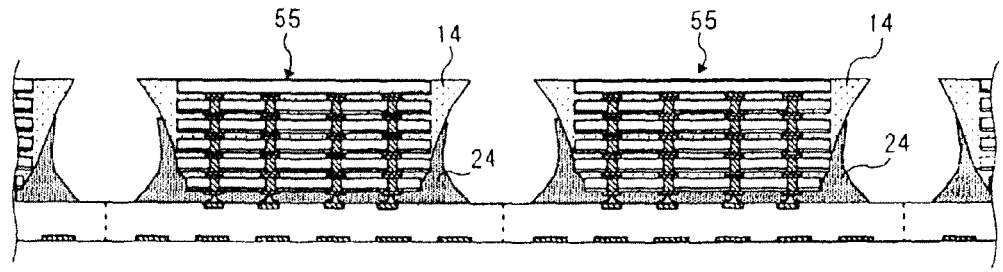

Support chip 50 of composite chip-stacked body 55 is then adsorbed and held by bonding tool 160, and mounted on product forming portions 26 of wiring board 20 (see FIG. 4B). Each bump electrode 12 of IF chip 60 and each wire bump 15 of wiring board 20 are joined together by using, for example, the thermocompression method. At this time, adhesive member 24 applied on wiring board 20 fills the gap between composite chip-stacked body 55 and wiring board 20 to bond and fix wiring board 20 to composite chip-stacked body 55 (see FIG. 4C). Since there is first sealing resin layer 14 formed into a tapered shape around composite chip-stacked body 55, creeping-up of adhesive member 24 can be prevented. Thus, breakage or a joining failure of composite chip-stacked body 55 caused by sticking of adhesive member 24 to bonding tool 160 can be reduced.

When composite chip-stacked body 55 exceeds the hot-curing temperature of underfiller 131 during implementation of the thermocompression method shown in FIG. 4B, even if the penetration electrodes of chip stacked body 11 expand and contract following a subsequent temperature drop, according to the present embodiment, stress generated by at least the expansion or the contraction of the penetration electrodes is applied on support chip 50 or IF chip 60.

Wiring board 20 on which composite chip-stacked body 55 has been mounted is set on a molding die including an upper die and a lower die in a transfer molding device (not shown), and the processing proceeds to molding.

A cavity (not shown) is formed in the upper die of the molding die to cover a plurality of composite chip-stacked bodies 55 all together. The cavity receives composite chip-stacked body 55 mounted on wiring board 20.

A sealing resin melted by heat is injected into the cavity formed in the upper die of the molding die. The sealing resin fills the cavity to cover entire composite chip-stacked body 55. For the sealing resin, a thermosetting resin such as an epoxy resin is used.

Figure 5A:
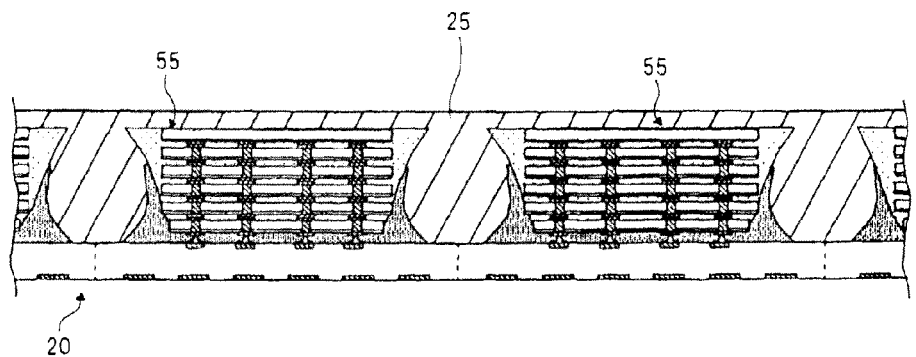

In the filled state of the cavity with the sealing resin, the sealing resin is hot-cured at a predetermined temperature of, for example, about 180° C. As shown in FIG. 5A, second sealing resin layer 25 is formed to cover composite chip-stacked bodies 55 which are mounted on the plurality of product forming portions 26. The sealing resin (second sealing resin layer 25) is baked at a predetermined temperature to be completely cured.

When the baking temperature in the processing shown in FIG. 5A exceeds the hot-curing temperature of underfiller 131, even if the penetration electrodes of chip stacked body 11 expand and contract following a subsequent temperature drop, according to the present embodiment, stress generated by at least the expansion or the contraction of the penetration electrodes is applied on support chip 50 or IF chip 60.

According to the present embodiment, the gaps among the chips of composite chip-stacked body 55 are sealed with first sealing resin layer (underfiller) 14, and second sealing resin layer 25 is formed to cover all composite chip-stacked bodies 55. Thus, generation of voids among semiconductor chips 10 can be suppressed.

Figure 5B:
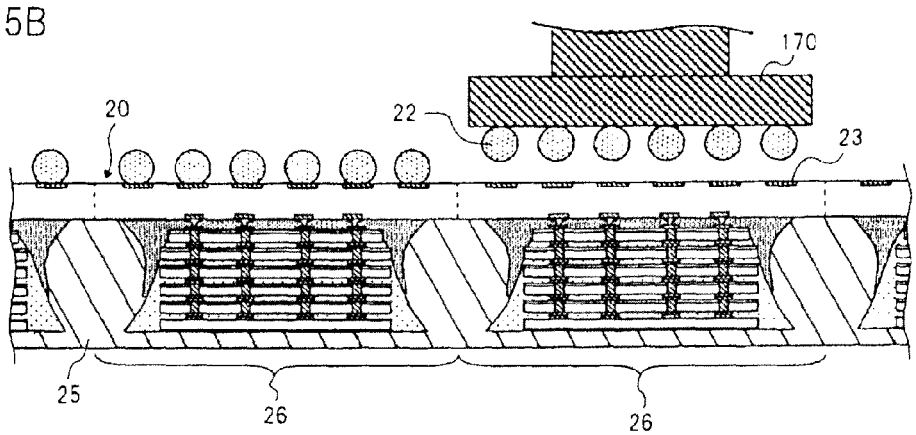

After second sealing resin layer 25 has been formed, the configuration shown in FIG. 5A is reversed up and down, and the processing proceeds to ball mounting. As shown in FIG. 5B, conductive metal balls 22 that become external terminals of the semiconductor device, such as solder balls, are connected to lands 23 formed on the other surface of wiring board 20.

In the ball mounting, the plurality of metal balls 22 are adsorbed and held by using mounting tool 170 that includes a plurality of adsorption holes coincident in position with lands 23 of wiring board 20. Fluxes are transferred to metal balls 22, and then held metal balls 22 are mounted in a lump on lands 23 of wiring board 20.

After metal balls 22 have been mounted on entire product forming portions 26, wiring board 20 is subjected to reflowing to interconnect metal balls 22 and lands 23.

When the temperature of the reflowing in the processing shown in FIG. 5B exceeds the hot-curing temperature of underfiller 131, even if the penetration electrodes of chip stacked body 11 expand and contract following a subsequent temperature drop, according to the present embodiment, stress generated by at least the expansion or the contraction of the penetration electrodes is applied on the support chip 50 or the IF chip 60.

After metal balls 22 have been connected, the processing proceeds to substrate dicing. Each product forming portion 26 is cut off at a predetermined dicing line to form semiconductor device 1.

Figure 5C:
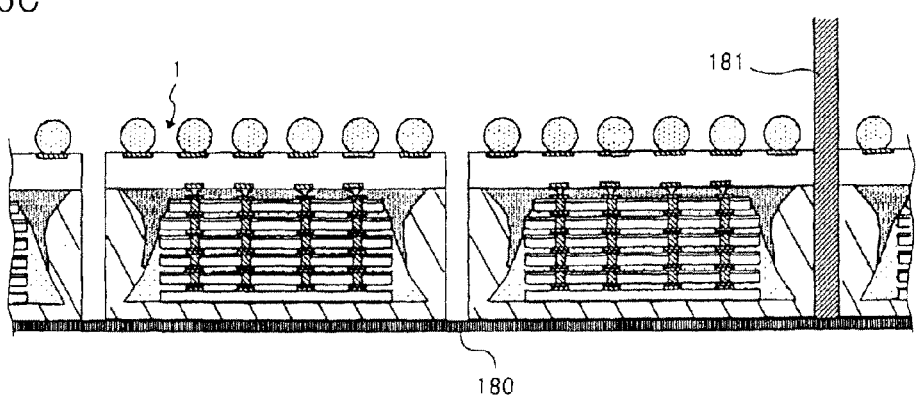

In the substrate dicing, product forming portion 26 is supported by adhering dicing tape 180 to second sealing resin layer 25. As shown in FIG. 5C, each product forming portion 26 is cut off at a predetermined dicing line by dicing blade 181 included in a dicing device (not shown). After the cutting-off, dicing tape 180 is picked up from product forming portion 26, thereby obtaining semiconductor device 1 of the CoC type shown in FIG. 1.

According to the present embodiment, the support member is disposed on the chip stacked body where the plurality of semiconductor chips is stacked. Thus, maximum stress of stress generated by the expansion or the contraction of the penetration electrodes following the temperature change during the manufacturing process is transferred to the support member, and the substrate surface of the support member receives the stress. As a result, cracks generated in the semiconductor chip can be suppressed.

To suppress generation of voids during the molding, the underfiller fills the gaps among the semiconductor chips and the gap between the chip stacked body and the support member. In this case, even when stress applied on the penetration electrodes increases due to curing and contraction of the underfiller, the stress can be received by the substrate surface of the support member.

When one of the two surfaces of the support member facing the semiconductor chip is set as a front surface, and the other surface not facing the semiconductor chip is set as a rear surface, no bump electrode is formed on the rear surface of the support member. This configuration can not only reduce generation of cracks caused by a bump electrode on the rear surface of the support member during flip-chip (FC) mounting of the chip stacked body but also improve thermal conduction and joining flatness, thereby stabilizing FC mounting conditions. When no penetration electrode is disposed in the support member, stress received from the semiconductor chip of the surface facing the support member can be more easily dispersed on the entire substrate of the support member.

When a second support member is disposed between the chip stacked body and the wiring board to electrically interconnect the penetration electrodes of the chip stacked body and external electrodes of the wiring board, stress applied on the bottom-stage chip of the chip stacked body can be suppressed better than the wiring board.

Setting a planar area of the support member roughly equal to that of the semiconductor chip disposed on the bottom stage of the chip stacked body enables conveyance of the composite chip-stacked body by the same bonding tool as that when a structure including no support member is conveyed. Thus, no new bonding tool is necessary, and manufacturing efficiency is improved.

When the silicon substrate is used for the material of the support member, thermal expansion coefficients can be made uniform among the semiconductor chips, and the place where stress concentrates can be changed to the support member well.

When the semiconductor chips are memory chips, and an interface chip is disposed to control the plurality of memory chips, a large-capacity memory apparatus can be provided.

The present embodiment has been directed to the semiconductor device that includes the IF chip. However, the IF chip is not always necessary. When an apparatus having the semiconductor device of the present embodiment mounted thereon includes a circuit for controlling semiconductor chips 10, functions for controlling semiconductor chips 10 overlap. In this case, semiconductor device 1 does not need IF chip 60.

Second Embodiment

The present embodiment is directed to a semiconductor device configured by adding an electrode pitch conversion function to the second support member in the semiconductor device according to the first embodiment. Hereinafter, as in the case of the first embodiment, the second support member is set as an IF chip, and its configuration will be described.

Figure 6:
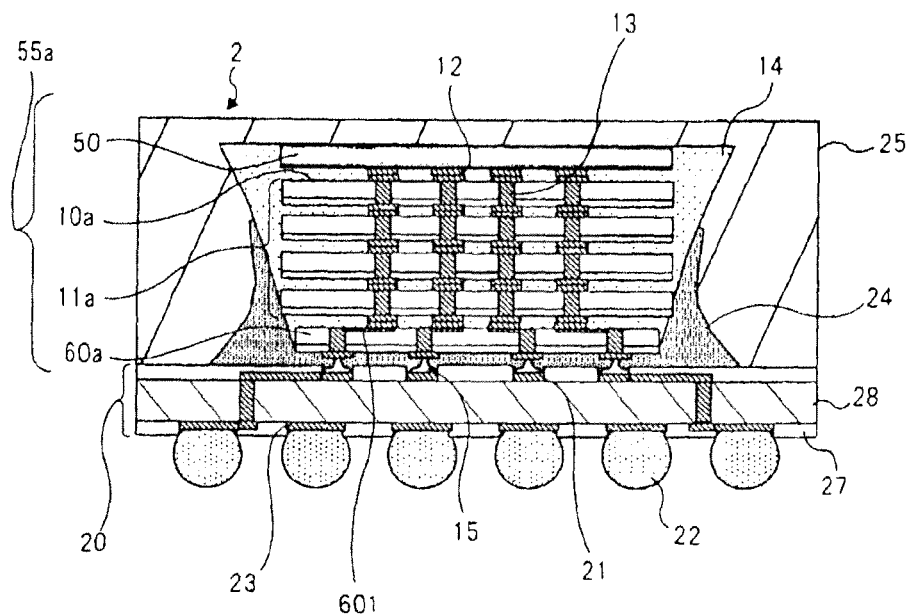
FIG. 6 is a sectional view showing a configuration example of a semiconductor device according to a second embodiment.

FIG. 6 is a sectional view showing a configuration example of the semiconductor device according to the second embodiment. Components similar to those of the first embodiment are denoted by similar reference numerals, and detailed description thereof is omitted.

Semiconductor device 2 shown in FIG. 6 includes IF chip 60a between semiconductor chip 10a of composite chip-stacked body 55a and wiring board 20. Pitches of bump electrodes 12 formed in semiconductor chip 10 of semiconductor device 1 shown in FIG. 1 are equal to those of connection pads 21 formed in wiring board 20. On the other hand, in semiconductor device 2 shown in FIG. 6, pitches of bump electrodes 12 formed in semiconductor chip 10a of chip stacked body 11a are smaller than those of connection pads 21 formed in wiring board 20. A configuration of IF chip 60a that solves the problem of this pitch difference will be described below.

One of two surfaces of IF chip 60a shown in FIG. 6 faces wiring board 20. On this surface, bump electrodes 12 are arranged corresponding to positions of connection pads 21 of wiring board 20. These bump electrodes 12 are connected to penetration electrodes 13 in IF chip 60a. The other surface of IF chip 60a faces semiconductor chip 10a. On this surface, bump electrodes 12 are arranged corresponding to positions of bump electrodes 12 of semiconductor chip 10a, and relay wirings 601 are laid out to be connected to these bump electrodes 12. Bump electrodes 12 arranged on the one surface of IF chip 60a are connected to wire bumps 15 on connection pads 21 of wiring board 20 via relay wirings 601, penetration electrodes 13, and bump electrodes 12. This is a result of compensation for deviation between the pitches by relay wirings 601.

The present embodiment provides, in addition to the effects of the first embodiment, an effect of dispersion of stress applied on bottom-stage semiconductor chip 10a of chip stacked body 11a to the entire substrate of IF chip 60a because of positional shifting between the penetration electrodes of chip stacked body 11a and the penetration electrodes of IF chip 60a. As described above, even when bump electrodes 12 of semiconductor chip 10a and connection pads 21 of wiring board 20 are different from each other in pitch, relay wirings 601 of IF chip 60a compensate for the deviation between the pitches. Thus, bump electrodes 12 of semiconductor chip 10a and connection pads 21 of wiring board 20 can be connected to each other in correspondence.

Third Embodiment

The present embodiment is directed to a semiconductor device configured by increasing the thickness of the support chip of the semiconductor device shown in FIG. 6. Hereinafter, the configuration of the semiconductor device according to the present embodiment will be described.

Figure 7:
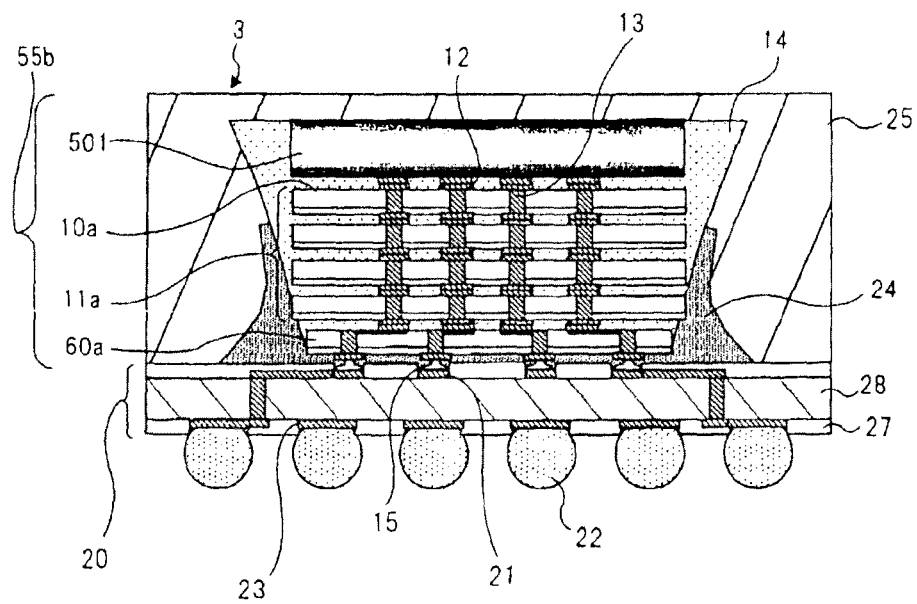
FIG. 7 is a sectional view showing a configuration example of a semiconductor device according to a third embodiment.

FIG. 7 is a sectional view showing a configuration example of the semiconductor device according to the third embodiment. Components similar to those of the first or second embodiment are denoted by similar reference numerals, and detailed description thereof is omitted.

Semiconductor device 3 shown in FIG. 7 includes support chip 501 on a top stage of composite chip-stacked body 55b. The thickness of support chip 501 is larger than that of semiconductor chip 10a. As shown in FIG. 7, the thickness of support chip 501 corresponds to the length of support chip 501 in a direction parallel to the stacking direction of semiconductor chips 10a. In the example shown in FIG. 7, the thickness of support chip 501 is, for example, about twice as large as that of semiconductor chip 10a.

According to the present embodiment, setting the thickness of the support member larger than that of top-stage semiconductor chip 10a of chip stacked body 11a improves rigidity of chip stacked body 11a and further improves the effect of reducing chip cracks. The present embodiment has been described based on the semiconductor device shown in FIG. 6. However, the support member of the present embodiment can be applied to the semiconductor device shown in FIG. 1.

Fourth Embodiment

The present embodiment is directed to a semiconductor device configured by applying a support member including penetration electrodes to the support chip of the semiconductor device shown in FIG. 6. Hereinafter, the configuration of the semiconductor device according to the present embodiment will be described.

Figure 8:
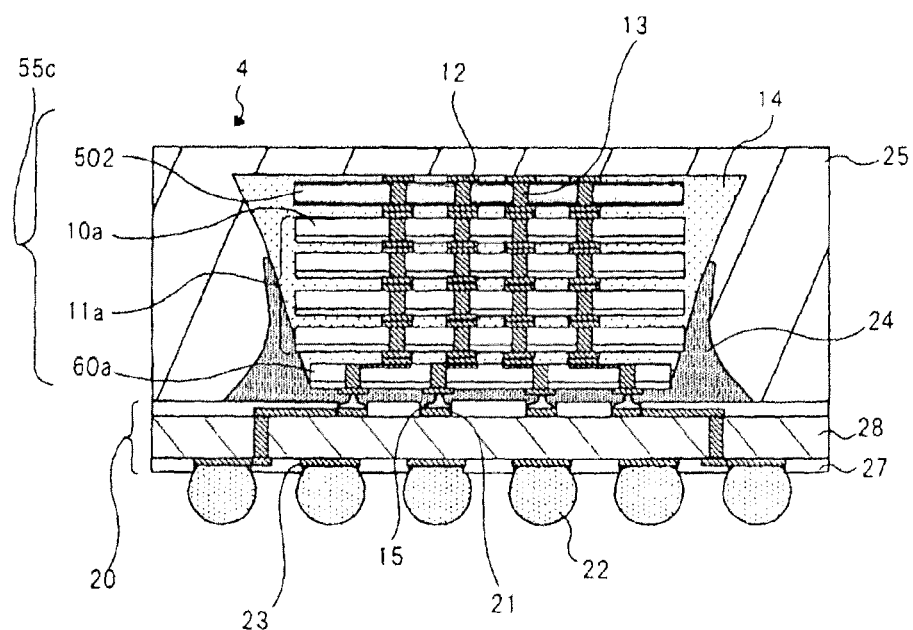
FIG. 8 is a sectional view showing a configuration example of a semiconductor device according to a fourth embodiment.

FIG. 8 is a sectional view showing a configuration example of the semiconductor device according to the fourth embodiment. Components similar to those of the first or second embodiment are denoted by similar reference numerals, and detailed description thereof is omitted.

Semiconductor device 4 shown in FIG. 8 includes support chip 502 on the top stage of composite chip-stacked body 55c. Support chip 502 includes pluralities of bump electrodes 12 respectively on one surface and on the other surface. Bump electrodes 12 on the one surface and bump electrodes 12 on the other surface are interconnected by penetration electrodes 13. The one surface faces semiconductor chip 10a. Bump electrodes 12 formed on this surface are arranged corresponding to positions of bump electrodes 12 of semiconductor chip 10a. Support chip 502 is, for example, a defective semiconductor chip that is not operated by a circuit.

The present embodiment provides, in addition to the effects of the first embodiment, an effect of effectively utilizing the defective semiconductor chip.

In the semiconductor device shown in FIG. 8, the penetration electrodes of semiconductor chip 10a of chip stacked body 11a and the penetration electrodes of support chip 502 match each other in position. However, the positions of these penetration electrodes can be different from each other. In this case, stress applied on bottom-stage semiconductor chip 10a is dispersed to the entire substrate of support chip 502.

The present embodiment has been described based on the semiconductor device shown in FIG. 6. However, the support member of the present embodiment can be applied to the semiconductor device shown in FIG. 1.

Fifth Embodiment

The present embodiment is directed to a semiconductor device configured by adding a chip having another function to the semiconductor device according to the first embodiment. Hereinafter, the configuration of the semiconductor device according to the present embodiment will be described.

Figure 9:
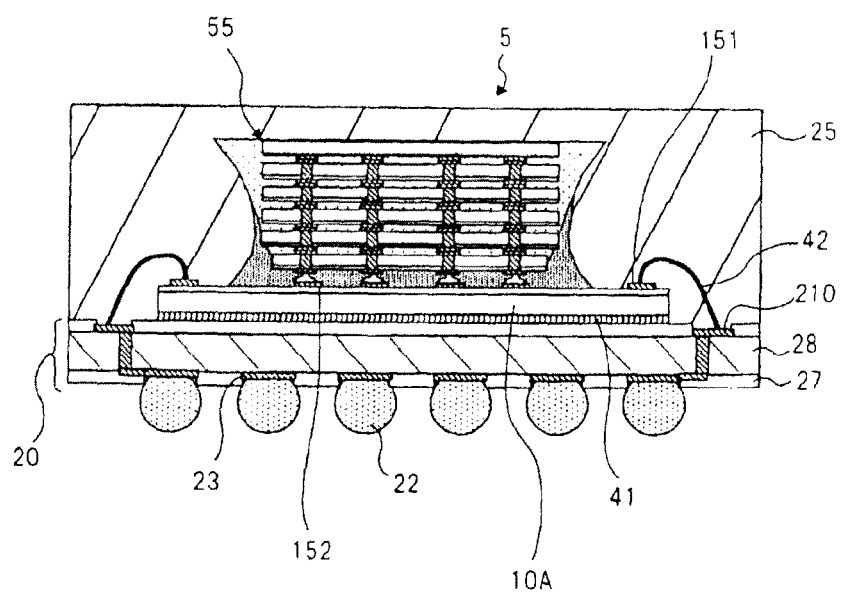
FIG. 9 is a sectional view showing a configuration example of a semiconductor device according to a fifth embodiment.

FIG. 9 is a sectional view showing a configuration example of the semiconductor device according to the fifth embodiment. Components similar to those of the first embodiment are denoted by similar reference numerals, and detailed description thereof is omitted.

As shown in FIG. 9, semiconductor device 5 according to the fifth embodiment includes function extension chip 10A in addition to composite chip-stacked body 55 of the first embodiment. Function extension chip 10A is a semiconductor chip that has a function different from that of semiconductor chip 10 and IF chip 60 of composite chip-stacked body 55.

Semiconductor device 5 is configured by sequentially stacking function extension chip 10A and composite chip-stacked body 55 on wiring board 20, and connecting and fixing composite chip-stacked body 55 to wiring board 20 via function extension function 10A.

Composite chip-stacked body 55 shown in FIG. 9 is prepared by the same procedure as that of the first embodiment. Function extension chip 10A includes, on one surface of a roughly square silicon (Si) substrate, a circuit (e.g., logic circuit) having a function different from that of semiconductor chip 10 and IF chip 60, and a plurality of electrode pads formed near its periphery and near its center.

The other surface of function extension chip 10A where no circuit is formed is bonded to wiring board 20 by using insulating adhesive member 41 such as a die attached film (DAF). Electrode pads 151 arranged near the periphery of function extension chip 10A are connected to connection pads 210 of wiring board 20 via conductive wires 42. Electrode pads 152 arranged near the center are connected to bump electrodes 12 formed in IF chip 60 of composite chip-stacked body 55 by a flip-chip connection method. Extension function chip 10A, composite chip-stacked body 55, and conductive wires 42 on wiring board 20 are sealed with second sealing resin layer 25.

The present embodiment provides the same effects as those of the first embodiment. In addition, function extension chip 10A that has a function different from that of semiconductor chip 10 and IF chip 60 is included. Thus, the semiconductor device that has a larger memory capacity or much more functions can be provided.

When the function extension chip is a logic chip, a chip stacked body is mounted on the logic chip disposed on one surface of the wiring board, and exposed penetration electrodes of the chip stacked body are electrically connected to external electrodes of the wiring board via the logic chip. Thus, a system-in-package can be configured.

The present embodiment has been described based on the semiconductor device shown in FIG. 1. However, the present embodiment can be applied to the semiconductor device shown in FIG. 6.

The preferred embodiments of the invention have been described. However, the present invention is not limited to the embodiments. Needless to say, the embodiments can be combined, and various changes can be made without departing from the gist of the invention.

For example, the first to fifth embodiments have been described by way of example of chip stacked body 11 where semiconductor chips 10 including the memory circuits having penetration electrodes 13 are stacked. However, as long as a configuration is employed where semiconductor chips 10 are interconnected by using penetration electrodes 13, for semiconductor chips 10 of chip stacked body 11, semiconductor chips having any type of function, such as semiconductor chips including memory circuits or logic circuits, can be combined.

The first to fifth embodiments have been described by way of example of chip stacked body 11 where four semiconductor chips 10 are stacked. However, as long as a configuration is employed where semiconductor chips 10 are interconnected by using penetration electrodes 13, any stacking number of semiconductor chips 10 can be set.

The first to fifth embodiments have been described by way of example of the semiconductor device of a ball-grid-array (BGA) type that uses metal balls 22 as the external terminals. However, the present invention can be applied to another semiconductor device of a package system such as a land-grid-array (LGA) type.

According to the present invention, even when stress is generated by at least expansion or contraction of the penetration electrodes in the chip stacked body caused by a temperature change during the manufacturing process, the stress is applied on the support member. Thus, generation of cracks in the semiconductor chips can be suppressed.

A method for manufacturing a semiconductor device, comprises: mounting a first semiconductor chip including penetration electrodes on a surface on which electrodes of a first support member including the electrodes are arranged, and connecting the electrodes of the first support member to the penetration electrodes of the first semiconductor chip; interconnecting penetration electrodes of semiconductor chips arranged adjacently to each other by stacking one or more second semiconductor chips including penetration electrodes on the first semiconductor chip; burying a resin layer among semiconductor chips of a chip stacked body where the first semiconductor chip and the one or more second semiconductor chips are stacked, and between the chip stacked body and the first support member; and connecting penetration electrodes of a top-stage second semiconductor chip among the one or more second semiconductor chips of the chip stacked body to electrodes of a wiring board that includes a predetermined wiring.

Additionally, in the method for manufacturing the semiconductor device, a planar area of the first support member may be equal to that of the first semiconductor chip.

It is apparent that the present invention is not limited to the above embodiments, but may be modified and changed without departing from the scope and spirit of the invention.

What is claimed is:

1. A semiconductor device comprising:
a chip stacked body where a plurality of semiconductor chips are stacked, and penetration electrodes respectively formed in the plurality of semiconductor chips are electrically interconnected in stacking order of the plurality of semiconductor chips;
a first support member that is disposed to face a first semiconductor chip that is a semiconductor chip formed in one end of the chip stacked body in a stacking direction of the plurality of semiconductor chips, and the first support member including electrodes electrically connected to the penetration electrodes of the first semiconductor chip; and
a wiring board that is disposed to face a second semiconductor chip that is a semiconductor chip formed in an end opposed to the one end of the chip stacked body in the stacking direction of the plurality of semiconductor chips, and the wiring board including external electrodes on a surface opposed to a surface facing the second semiconductor chip to be electrically connected to the penetration electrodes of the second semiconductor chip, wherein a material for the first support member is similar to that for the plurality of semiconductor chips.

2. The semiconductor device according to claim 1, further comprising a resin layer that is buried among the plurality of semiconductor chips and between the chip stacked body and the first support member.

3. The semiconductor device according to claim 1, wherein a thickness of the first support member is larger than that of the first semiconductor chip.

4. The semiconductor device according to claim 1, wherein a planar area of the first support member is equal to that of the first semiconductor chip.

5. The semiconductor device according to claim 1, wherein the first support member is a semiconductor chip that includes penetration electrodes and that does not have a circuit function.

6. The semiconductor device according to claim 1, wherein the first support member is a semiconductor chip that includes penetration electrodes arranged in positions different from those of the penetration electrodes of the chip stacked body to be electrically connected to the penetration electrodes.

7. A semiconductor device comprising:
a chip stacked body where a plurality of semiconductor chips are stacked, and penetration electrodes respectively formed in the plurality of semiconductor chips are electrically interconnected in stacking order of the plurality of semiconductor chips;
a first support member that is disposed to face a first semiconductor chip that is a semiconductor chip formed in one end of the chip stacked body in a stacking direction of the plurality of semiconductor chips, and the first support member including electrodes electrically connected to the penetration electrodes of the first semiconductor chip;
a wiring board that is disposed to face a second semiconductor chip that is a semiconductor chip formed in an end opposed to the one end of the chip stacked body in the stacking direction of the plurality of semiconductor chips, and the wiring board including external electrodes on a surface opposed to a surface facing the second semiconductor chip to be electrically connected to the penetration electrodes of the second semiconductor chip; and
a second support member that is disposed between the chip stacked body and the wiring board to electrically connect the external electrodes of the wiring board to the penetration electrodes of the second semiconductor chip.

8. The semiconductor device according to claim 7, further comprising a resin layer that is buried among the plurality of semiconductor chips and between the chip stacked body and the first support member.

9. The semiconductor device according to claim 7, wherein a thickness of the first support member is larger than that of the first semiconductor chip.

10. The semiconductor device according to claim 7, wherein a planar area of the first support member is equal to that of the first semiconductor chip.

11. The semiconductor device according to claim 7, wherein the first support member is a semiconductor chip that includes penetration electrodes and that does not have a circuit function.

12. The semiconductor device according to claim 7, wherein the first support member is a semiconductor chip that includes penetration electrodes arranged in positions different from those of the penetration electrodes of the chip stacked body to be electrically connected to the penetration electrodes.

13. The semiconductor device according to claim 7, wherein the second support member is a semiconductor chip that includes a predetermined circuit formed on one surface, first electrodes electrically connected to the penetration electrodes of the second semiconductor chip, and second electrodes connected to the first electrodes by wirings, and the second electrodes and the external electrodes of the wiring board are electrically interconnected by wires.

14. The semiconductor device according to claim 7, wherein the second support member is a semiconductor chip that includes penetration electrodes arranged in positions different from those of the penetration electrodes of the chip stacked body to be electrically connected to the penetration electrodes.

15. A semiconductor device comprising:
a chip stacked body where a plurality of semiconductor chips are stacked, and penetration electrodes respectively formed in the plurality of semiconductor chips are electrically interconnected in stacking order of the plurality of semiconductor chips;
a first support member that is disposed to face a first semiconductor chip that is a semiconductor chip formed in one end of the chip stacked body in a stacking direction of the plurality of semiconductor chips, and the first support member including electrodes electrically connected to the penetration electrodes of the first semiconductor chip; and
a wiring board that is disposed to face a second semiconductor chip that is a semiconductor chip formed in an end opposed to the one end of the chip stacked body in the stacking direction of the plurality of semiconductor chips, and the wiring board including external electrodes on a surface opposed to a surface facing the second semiconductor chip to be electrically connected to the penetration electrodes of the second semiconductor chip,
wherein the first support member is a semiconductor chip that has a circuit function that does not use a penetration electrode.

16. The semiconductor device according to claim 15, further comprising a resin layer that is buried among the plurality of semiconductor chips and between the chip stacked body and the first support member.

17. The semiconductor device according to claim 15, wherein a thickness of the first support member is larger than that of the first semiconductor chip.

18. The semiconductor device according to claim 15, wherein a planar area of the first support member is equal to that of the first semiconductor chip.

19. The semiconductor device according to claim 15, wherein the first support member is a semiconductor chip that includes penetration electrodes and that does not have a circuit function.

20. The semiconductor device according to claim 15, wherein the first support member is a semiconductor chip that includes penetration electrodes arranged in positions different from those of the penetration electrodes of the chip stacked body to be electrically connected to the penetration electrodes.

21. A semiconductor device comprising
a wiring board including a first surface, a second surface opposed to the first surface and a plurality of external terminals formed on the second surface;
a plurality of memory chips each including a semiconductor substrate and a plurality of penetration electrodes penetrate the semiconductor substrate, the memory chips being stacked with one another over the first surface of the wiring board such that the penetration electrodes of a lower one of the memory chips being vertically aligned respectively with the penetration electrodes of an upper one of the memory chips;
an additional chip stacked on an uppermost one of the memory chips, the additional chip being free from including one or more penetration electrodes that are vertically aligned with an associated one or ones of the penetration electrodes of the uppermost one of the memory chips; and
a logic chip disposed between the wiring board and the lower one of the memory chips, the penetration electrodes of the lower one of the memory chips being electrically connected respectively to external terminals of the wiring board via the logic chip.

22. The semiconductor device according to claim 21, further comprising:
insulating resin filling gaps among the plurality of memory chips and between the uppermost one of the memory chips and the additional chip.

* * * * *